United States Patent
Kux et al.

(10) Patent No.: US 7,813,169 B2
(45) Date of Patent: Oct. 12, 2010

(54) INTEGRATED CIRCUIT AND METHOD TO OPERATE AN INTEGRATED CIRCUIT

(75) Inventors: Andreas Kux, Haar (DE); Detlev Richter, Munich (DE)

(73) Assignee: Qimonda Flash GmbH, Dresden (DE)

(*) Notice: Subject to any disclaimer, the term of this patent is extended or adjusted under 35 U.S.C. 154(b) by 286 days.

(21) Appl. No.: 12/016,774

(22) Filed: Jan. 18, 2008

(65) Prior Publication Data
US 2009/0185441 A1    Jul. 23, 2009

(51) Int. Cl.
*G11C 11/34* (2006.01)
*G11C 16/04* (2006.01)

(52) U.S. Cl. .................. 365/185.02; 365/185.17; 365/185.18; 365/185.19; 365/185.29

(58) Field of Classification Search .......... 365/185.02, 365/185.17, 185.18, 185.29
See application file for complete search history.

(56) References Cited

U.S. PATENT DOCUMENTS

| | | |
|---|---|---|
| 5,867,429 A | 2/1999 | Chen et al. |
| 6,011,725 A | 1/2000 | Eitan |
| 6,052,106 A * | 4/2000 | Maltese ................ 345/97 |
| 7,417,895 B2 * | 8/2008 | Cho .................. 365/185.17 |
| 2006/0158938 A1 | 7/2006 | Shappir et al. |
| 2007/0076464 A1 | 4/2007 | Koebernick et al. |
| 2008/0019164 A1 * | 1/2008 | Hemink et al. ........... 365/100 |
| 2008/0089132 A1 * | 4/2008 | Ito .................. 365/185.22 |
| 2008/0089134 A1 * | 4/2008 | Ito .................. 365/185.29 |
| 2008/0089135 A1 * | 4/2008 | Ito .................. 365/185.29 |
| 2009/0109759 A1 * | 4/2009 | Aritome ............ 365/185.19 |

FOREIGN PATENT DOCUMENTS

EP    1 271 553 A2    1/2003

* cited by examiner

*Primary Examiner*—Ly D Pham
(74) *Attorney, Agent, or Firm*—Slater & Matsil, L.L.P.

(57) ABSTRACT

Disclosed embodiments relate to integrated circuits, a method to operate an integrated circuit, and a method to determine an electrical erase sequence. More particularly, the application relates to devices having at least two memory cells and methods relating to its operation.

18 Claims, 7 Drawing Sheets

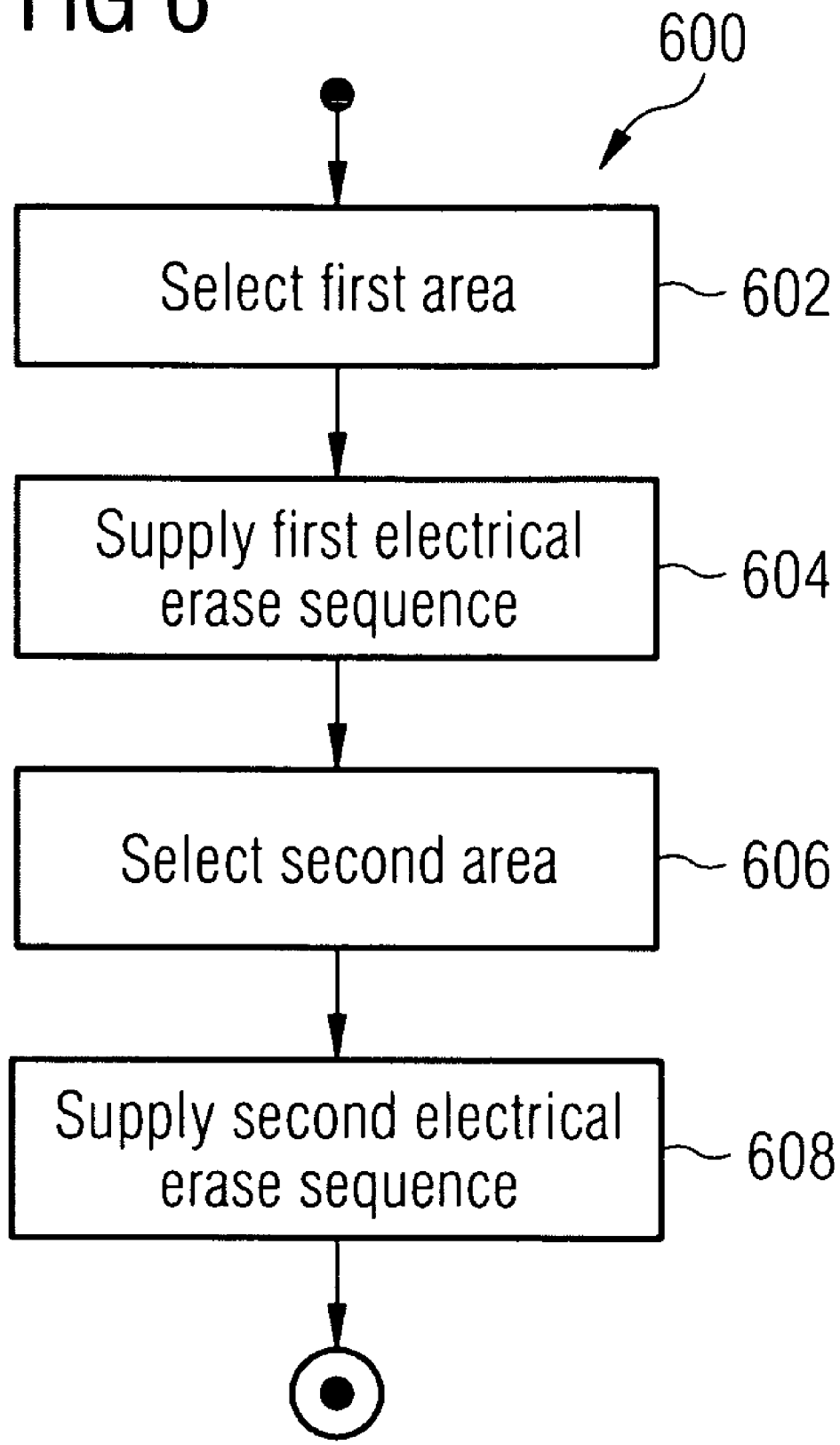

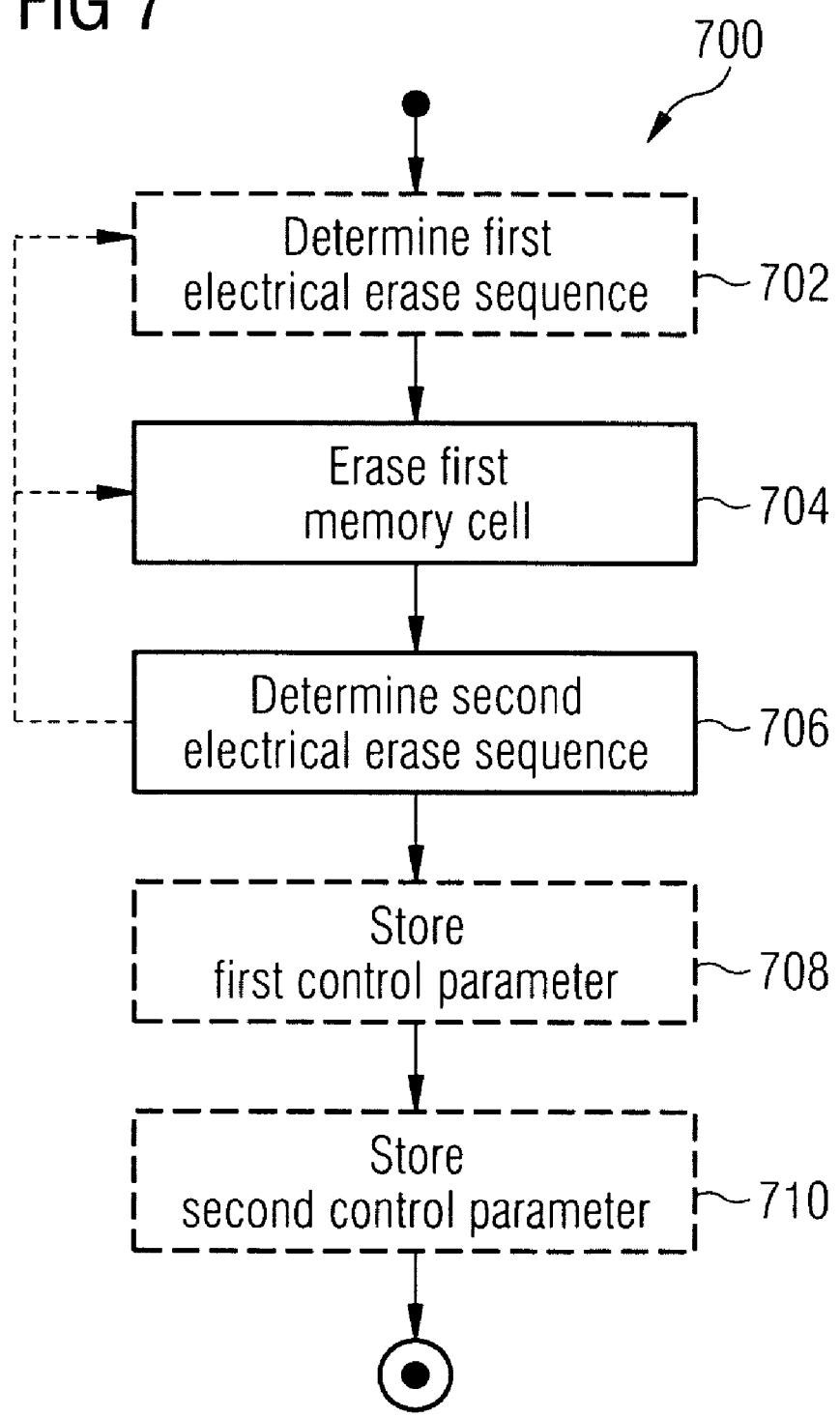

INTEGRATED CIRCUIT AND METHOD TO OPERATE AN INTEGRATED CIRCUIT

TECHNICAL FIELD

Embodiments of the invention relate to integrated circuits comprising at least two memory cells and methods to operate an integrated circuit.

BRIEF DESCRIPTION OF THE DRAWINGS

The various aspects of the present application will be described using illustrative yet non-limiting embodiments as shown in the attached drawings. In particular:

FIG. 6 shows a flow chart of an embodiment of a method to operating an integrated circuit; and FIG. 7 shows a flow chart of an embodiment of a method to determine an electrical erase pattern.

DETAILED DESCRIPTION OF ILLUSTRATIVE EMBODIMENTS

Figure 1:
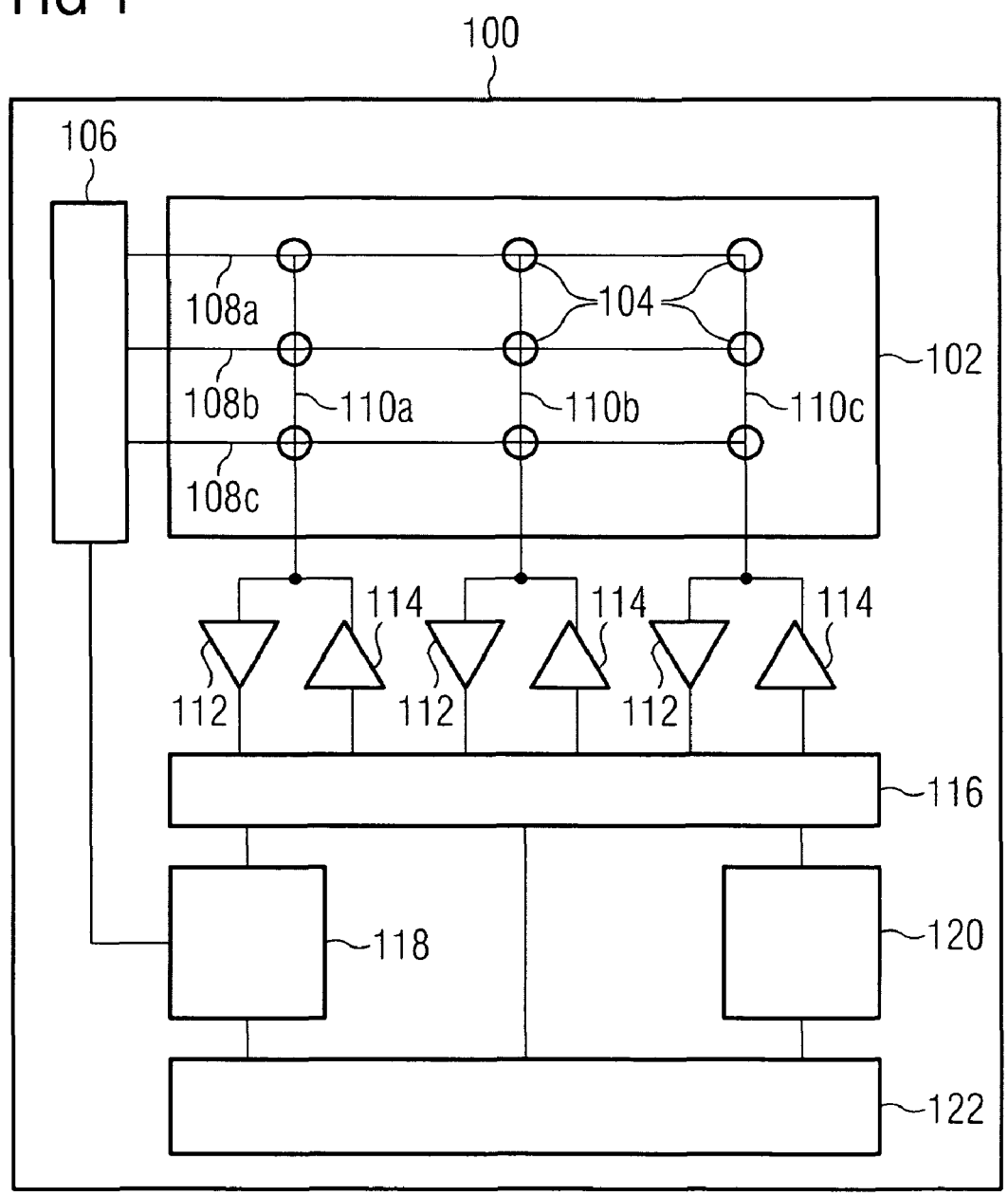
FIG. 1 shows a block diagram of an integrated circuit according to one embodiment.

FIG. 1 shows an integrated circuit 100 according to an embodiment of the invention. The integrated circuit 100 comprises a plurality of memory cells 104. The memory cells 104 can be non-volatile memory cells that can be programmed to store a programming state representative of digital data. The programming states of the memory cells can be erased by application of an electrical erase sequence.

The memory cells 104 are arranged in a regular structure. In particular, they may be arranged in an array 102 having rows and columns. FIG. 1 shows three rows and three columns as an example. Each row of memory cells 104 is connected to a common wordline 108. In order to aid differentiation, the three example wordlines 108 are labeled 108a, 108b and 108c, respectively. The wordlines 108 are coupled to and controlled by a wordline selection unit 106.

Each column of the array 102 is associated with a common bitline 110. The three example bitlines 110 shown in FIG. 1 are labeled 110a, 110b and 110c, respectively. The wordlines 108 and bitlines 110 shown in FIG. 1 are an excerpt from a much larger array 102. In particular, the integrated circuit 100 may comprise thousands, millions or billions of memory cells 104.

Each bitline 110 is connected in each case to a sense amplifier 112 and a programming unit 114. The sense amplifiers 112 and the programming units 114 are all together connected to a control unit 116. Both, the control unit 116 and the wordline selection unit 106, are connected to an address decoder 118. In addition, the control unit 116 is connected to a power supply unit 120. The control unit 116, the address decoder 118 and the power supply unit 120 are all connected to an interface unit 122. The interface unit 122 enables connection from the integrated circuit 100 to external circuitry that may be an external host system (not shown).

A programming state of a memory cell 104 can be altered by application of one or more electrical erase pulses. The erase pulses are provided to the bitline 110 or wordline 108 that are connected to the memory cell 104 to be erased. Erasing memory cells 104 in this way requires electrical energy. If many memory cells 104 are to be erased together, the power supply unit 120 or an external host system must provide sufficient electrical energy to provide the required erase pulses to all memory cells 104 to be erased.

If energy consumption of the integrated circuit 100 is limited, it may not be possible to erase all or a large number of memory cells 104 in a single operation. In order to limit peak power or peak load of the integrated circuit 100, the control unit 116 can divide an erase operation into several phases.

In the embodiment shown in FIG. 1, the memory cells 104 of the array 102 are divided into two separate groups. The two groups are then erased separately from one another. For example, a first group of memory cells 104 comprises memory cells 104 connected to even-numbered bitlines 110, i.e., bitline 110b. The second group of memory cells 104 comprises memory cells 104 connected to odd-numbered bitlines 110, i.e., bitlines 110a and 110c.

In a first step, an erase pulse is applied to the bitline 110b. At the same time, the bitlines 110a and 110c are disconnected by means of the control unit 116 or the programming units 114. Consequently, the bitlines 110a and 110c are left floating while the first erase pulse is applied to the bitlines 110b.

In a further step, the bitline 110b is disconnected while the bitlines 110a and 110c are connected to an erase pulse generator via the control unit 116 and the programming units 114. In this way, erasing the entire array 102 is divided into two phases, thus reducing the instantaneous load on the power supply unit 120.

Of course, other schemes for selecting groups of memory cells 104 may be applied. According to another embodiment, memory cells 104 connected to every third bitline 110 may be selected to form three different groups. In another embodiment, a selection of groups is performed by wordlines 108 or blocks of the array 102.

Due to inductive and capacitive effects the individual memory cells 104, wordlines 108 and bitlines 110 are not electrically independent of each other. In particular, the bitlines 110a and 110c not connected during a first phase of the erase operation may be charged to an intermediate voltage level. For example, applying an erase pulse of, e.g., 10 V to the bitline 110b may charge the bitlines 110a and 110c to a voltage potential of, e.g., 2 V. Inversely, having applied the first erase pulse to bitline 110b may leave it in an electrically charged state once it is disconnected by means of the programming unit 114 or the control unit 116.

In practice, due to electrical coupling, leakage currents and other electrical effects, the memory cells 104, wordlines 108 or bitlines 110 may be charged to a voltage potential affecting the electrical field within individual memory cells 104 and thus any operation on it. Consequently, by erasing the first and second group of memory cells 104 in a successive fashion, a systematic bias is put on a threshold level of a memory cell 104.

In the embodiment shown in FIG. 1, the specific voltage potential present on a bitline 110 or wordline 108 during a programming operation or an erase operation depends not only on the previous operation but also on the specific location of the memory cell 104, e.g., whether the memory cell 104 or bitline 110 is arranged in a central or peripheral area of an array 102.

Conventional non-volatile memory devices apply a sequence of erase pulses to each memory cell. After applying one or a group of erase pulses to a memory cell, the actual threshold level of at least one selected memory cell is verified by means of a verification step. This is typically performed by means of sense amplifiers. If the memory cell is already erased to a predefined threshold level, no more erase pulses are sent to that memory cell.

However, apart from additional verification logic and effort, this requires a multitude of erase pulses to be provided to each memory cell 104 during an erase operation. Measurements have shown that applying a plurality of relatively low or short erase pulses to a memory cell 104 puts more electrical stress on the memory cell 104 than providing a single erase pulse having sufficient amplitude and duration to erase the memory cell 104 in a single step. For example, a lattice structure of a thin layer of a semiconductor memory cell, like a silicon dioxide layer used to isolate a charge storage element from a semiconductor substrate, may be altered or destroyed by application of a large number of erase pulses to the memory cell. In addition, due to the added verification effort and additional erase pulses, time and electrical energy is wasted.

According to one embodiment, only a single erase pulse is used during any one erase operation of a group of memory cells. If only a single erase pulse adapted to the specific requirements of the first group and the second group of memory cells is used for erasing, additional stress caused by using a plurality of erase pulses can be avoided. In addition, the erase operation may be completed in a shorter amount of time, making it more efficient.

With reference to the embodiment shown in FIG. 1, an improved erase mechanism is described below. Only one or at most a few erase pulses are sent to each memory cell 104 to be erased. For this to happen, the control unit 116 determines the shape, amplitude or duration of the erase pulse or combination thereof required for each individual memory cell 104 of the array 102. This operation may reduce stress on the memory cell 104.

For example, the control unit 116 may determine an operational state of the bitline 110b by means of the corresponding sense amplifier 112. The sense amplifier 112 may determine the charging state of the bitline 110b, i.e., if it is in a pre-charged state. If the bitline 110b is found to be in a pre-charged state, the duration of a programming pulse provided to that bitline may be reduced or prolonged with respect to a programming pulse provided to one of the bitlines 110a and 110c, which are not in a pre-charged state.

In this case, the memory cells 104 connected to the bitlines 110a and 110c receive a different electrical erase pattern with respect to the memory cells 104 connected to the bitline 110b. The second electrical erase sequence is determined based on a charge state of the bitlines 110. The charge state of the bitline 110 is determined before application of the second electrical erase sequence.

FIG. 2A to 3B show different electrical erase sequences and their respective effect on an arrangement of eight memory cells 104 connected to five bitlines 110. The bitlines 110 are used to program or erase the eight memory cells 104 as described above by means of providing electrical erase and programming sequences, respectively.

The eight memory cells 104 are located in close proximity of one another, i.e. neighboring memory cells 104 are either connected to the same or two neighboring bitlines 110. In the particular example, the three central bitlines 110 are connected to a group of two memory cells 104 each. The two peripheral bitlines 110 are each connected to a single memory cell 104. The arrangement described corresponds, for example, to a single row of the memory device shown in FIG. 4. Other arrangements, as described with respect to any of the other exemplary embodiments, may exhibit similar or different behavior.

Figure 2A:
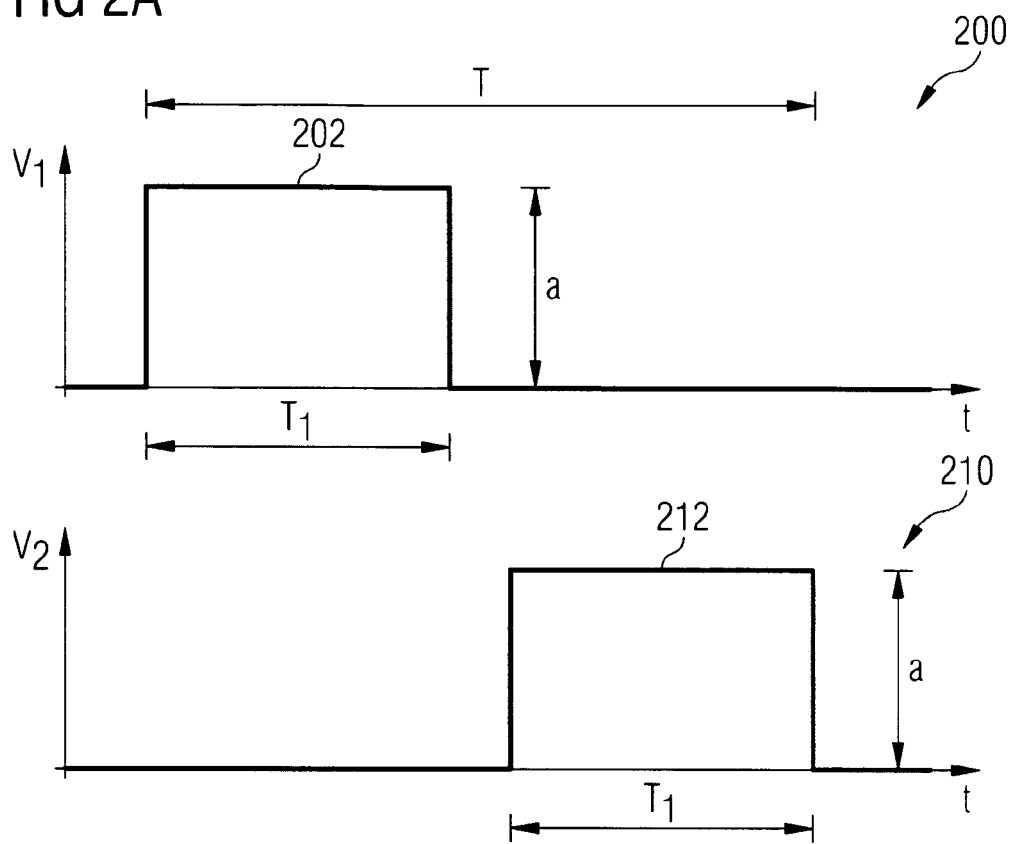
FIG. 2A shows a first set of electrical erase sequences provided to a plurality of memory cells.

FIG. 2A shows a first set of electrical erase sequences provided to the memory cells 104. In particular, FIG. 2A shows a first electrical erase sequence 200 and a second electrical erase sequence 210 provided to a first and second group of bitlines 110, respectively. The erase sequences are provided as a first voltage $V_1$ and a second voltage $V_2$, each voltage applied to respective groups of bitlines 110.

The first electrical erase sequence 200 comprises a single electrical erase pulse 202 having a rectangular shape with a duration of $T_1$ and an amplitude of a. For example, the erase pulse 202 may have a duration of 10.0 ms and an amplitude of 18 V. The second electrical erase sequence 210 also comprises a single electrical erase pulse 212 having a rectangular shape with a duration of $T_2$ and an amplitude of a. That is, the first and the second electrical erase sequences 200 and 210 are equal.

As can be seen in FIG. 2A, the first and second electrical erase sequences 200 and 210 are provided successively one after the other. Provision of both electrical erase sequences takes a minimum time of $T>=T_1+T_2$. For example, the total time T taken may be 22.0 ms.

Figure 2B:
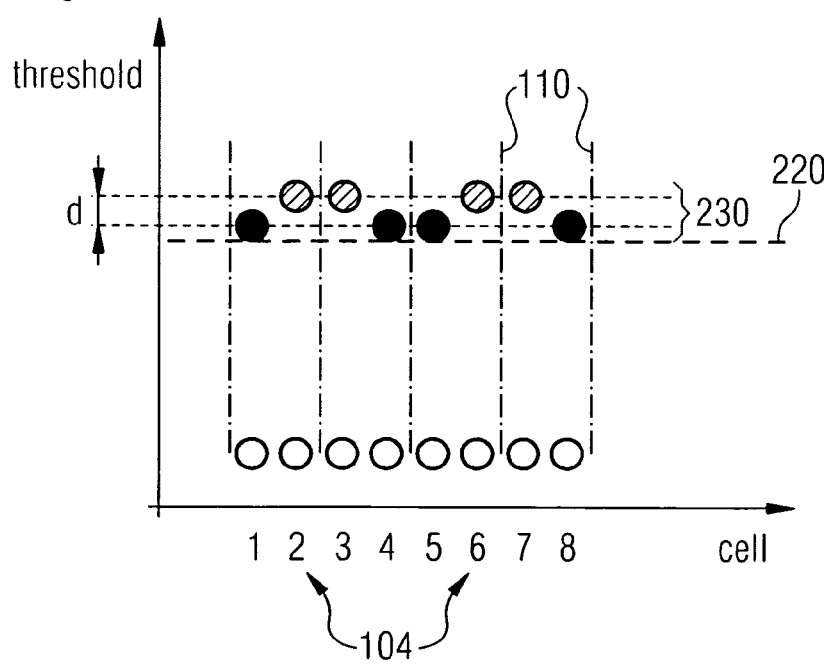
FIG. 2B shows a first distribution of threshold levels based on the electrical erase sequences of FIG. 2A.

FIG. 2B shows a first distribution of resulting threshold levels for the plurality of memory cells 104 based on the application of the electrical erase sequences 200 and 210 of FIG. 2A. The threshold levels characterize the programming states of each one of the eight memory cells 104.

The hollow circles in the bottom part of FIG. 2B show the threshold level of the memory cells 104 in a programmed state. The remaining, solid or hatched, circles in the upper part of FIG. 2B show the memory cells 104 in an erased state after receiving the first set of electrical erase sequences 200 and 210 described with reference to FIG. 2A.

In order to detect a memory cell 104 to be in an erased state, the actual threshold of the memory cells 104 has to exceed a predefined threshold level 220. This predefined threshold level 220 is indicated by a dashed line in FIG. 2B.

In this particular example, the eight memory cells 104 are erased in three phases. In a first phase, all memory cells 104 are brought into a programmed state as indicated by the hollow circles of FIG. 2B.

Then, in a subsequent second phase, all memory cells 104 connected to an even-numbered bitline 110, i.e., the cells having the indices 2, 3, 6 and 7, are erased using the first electrical erase sequence 200. Their respective threshold level corresponds to an erase state of the memory cells 104 and is indicated by the hatched circles.

Then, all memory cells 104 connected to an odd-numbered bitline 110 are erased by application of the second electrical erase sequence 210. The threshold level of the corresponding memory cells 104 also corresponds to the erased state. It is indicated by the solid circles in FIG. 2B.

If equal electrical erase sequences are provided to the eight memory cells 104 as described above, the resulting threshold levels of four memory cells lie closely above the predefined threshold level 220. However, the resulting threshold levels of the four other memory cells 104 lie further above the predefined threshold level 220 by an amount d. This results in an extended distribution of threshold levels of the memory cells 104 in the erased state. The distribution comprises a range 230 of threshold levels.

Erasing the four memory cells 104 to a threshold level above the predefined threshold level 220 results in a waste of electrical energy. In addition, over-erasing them subjects those memory cells 104 to some unnecessary electrical stress.

FIG. 2B discloses a regular pattern of threshold levels corresponding to the erased state. The regularity of the pattern correlates with the bitlines 110. In particular, all memory cells connected to an odd-numbered bitline have a lower threshold level in the erased state than those connected to the even-numbered bitlines 110.

In the described example, erasing the memory cells 104 connected to the even-numbered bitlines 110 affects the electrical environment of the remaining memory cells 104, i.e., the memory cells 104 having the index 1, 4, 5 and 8. For example, by erasing the first group of memory cells 104 using the even-numbered bitlines 110, the odd-numbered bitlines 110 may be charged to an intermediate voltage potential due to the previously discussed coupling effects.

When trying to erase the other memory cells 104, the difference in voltage used for adding or removing charge to or from a charge storage element is reduced, reducing the overall effectiveness of the erase procedure. Consequently, the memory cells 104 connected to odd-numbered bitlines 110 are erased to a lower threshold level, if a fixed electrical erase sequence is supplied to both the odd-numbered and even-numbered bitlines 110. Depending on the physical arrangement of the memory cells 104 and the sequence of steps performed during an erase operation, other interdependencies may exist.

Figure 3A:
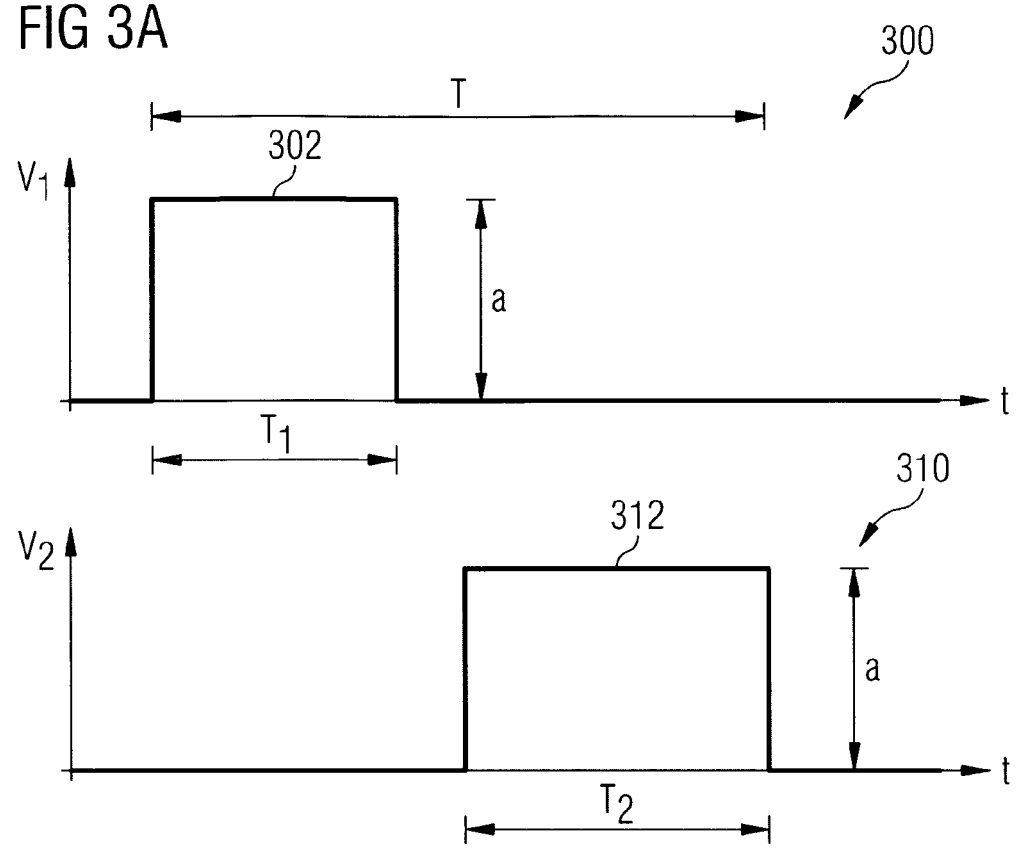
FIG. 3A shows a second set of electrical erase sequence provided to a plurality of memory cells.

FIG. 3A shows a second set of electrical erase sequences provided to the plurality of memory cells 104. In particular, FIG. 3A shows a first electrical erase sequence 300 and a second electrical erase sequence 310 having a first voltage $V_1$ and a second voltage $V_2$ provided to a first and second group of bitlines 110, respectively.

The first electrical erase sequence 300 comprises a single electrical erase pulse 302 having a rectangular shape with a duration of $T_1$ and an amplitude of a. For example, the erase pulse 302 may have a duration of 8.0 ms and an amplitude of 18 V. The second electrical erase sequence 310 comprises a single electrical erase pulse 312 having a rectangular shape with the same amplitude of a. However, the second erase pulse 312 has a duration $T_2$ which is longer than the duration $T_1$ of the first erase pulse 302. For example, the erase pulse 312 may have a duration $T_2$ of 10.0 ms. That is, the first and the second electrical erase sequences 300 and 310 are different.

According to alternative embodiments, electrical erase sequences may comprise one or multiple erase pulses. They may be determined in terms of their overall duration, average amplitude or sequence envelope, i.e., the temporal development of the amplitude of subsequent erase pulses. The erase sequences may also be characterized by means of their individual erase pulses, in particular their number, duration, amplitude or shape.

As described above, the first and second electrical erase sequences 300 and 310 are provided successively. Performing of both electrical erase sequences takes a minimum time of $T>=T_1+T_2$. For example, the total time T taken may be 20.0 ms. One should note that the total time T of the second set of electrical erase patterns 300 and 310 is shorter than the first set of electrical erase patterns 200 and 210 shown in FIG. 2A.

Figure 3B:
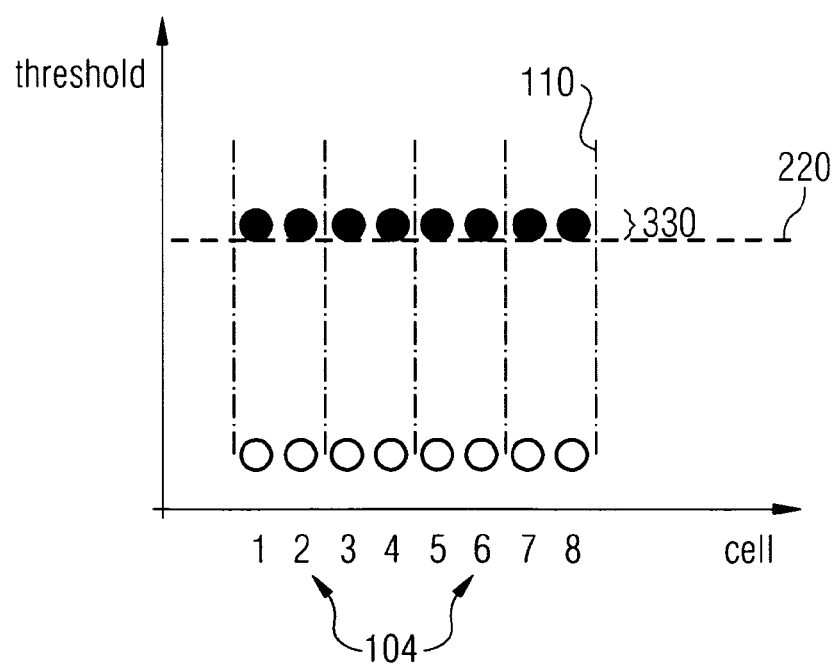
FIG. 3B shows a second distribution of threshold levels based on the electrical erase sequences of FIG. 3A.

FIG. 3B shows a second distribution of threshold levels based on the provision of the electrical erase sequences 300 and 310 of FIG. 3A. It indicates an improved distribution of threshold levels of the plurality of memory cells 104 in the erased state, which is narrower than the distribution shown in FIG. 2B.

As before, the hollow circles shown in the lower part of FIG. 3B indicate the memory cells 104 in a programmed state, while the solid circles shown in the upper part of FIG. 3B show the threshold levels of memory cells 104 in an erased state.

The distribution of FIG. 3B has a narrower range 330 than the range 230 indicated in FIG. 2B. The narrow distribution indicated in FIG. 3B is achieved by applying the different electrical erase sequences 300 and 310 shown in FIG. 3A to different groups of memory cells 104.

For example, based on a previous observed widening of the distribution of threshold values shown in FIG. 2B by an amount d, a corrected first or second duration $T_1$ or $T_2$ may be determined. One way of determining the corrected first and second duration $T_1$ and $T_2$ may comprise to divide them with a ratio between an uncorrected threshold level and a desired threshold level. For example, if the memory cells 104 connected to an even bitline 110 were previously erased to 125% of the predefined threshold level 220 using a duration of $T_2$, the corrected duration $T_1$ may be set to $T_2/1.25$.

Of course other, more sophisticated or complex, correction schemes may be applied depending on the actual interdependencies between the first and second electrical erase sequence. In particular, non-linear correction may be performed. The actual correction may be based on an analysis of an actual integrated circuit, on a simulation of an integrated circuit or computed just in time. That is, the required determination may take place during a design stage, a grading process, an initialization of an integrated circuit or immediately before erasing a group of memory cells 104.

According to a further embodiment of the invention, multi-level memory cells are comprised in an integrated circuit. Multi-level cells can be programmed to a plurality of threshold levels or threshold level ranges, wherein each threshold level or range is used to indicate one of a plurality of programming states. For example, a two-bit memory cell 104 may comprise four programming states associated with four different threshold levels. A narrow distribution as shown in FIG. 3B helps to improve the operation of multi-level memory cells. This is because the likelihood of neighboring threshold ranges to overlap is significantly reduced.

There is a plurality of effects that influence the shape, duration, and amplitude of an erase pulse or electrical erase sequence required to erase memory cells 104 to a predefined threshold level. Among these is the so-called second bit effect, which is known from the so-called twin-bit architecture. In the twin-bit architecture two charge trapping regions are arranged in a single memory cell. The two charge-trapping regions represent two different bits of the memory cell and can be programmed or erased separately.

In addition, different array sizes, types and layouts are used in integrated circuits. The size, type and layout of an array comprising a plurality of memory cells 104 also influences the effects that erasing one group of memory cells 104 has on the erasure of another group of cells 104. Also, the particular shape or dimension of an individual memory cell 104 or charge storage element, for example, the length of a memory cell 104, affects its response to an electrical erase sequence.

By adapting an electrical erase sequence to the specific characteristics of a group of memory cells 104, most systematic effects can be accounted and compensated for, thus making the concepts described herein applicable to a wide range of systematic and disturbing effects occurring in the operation of memory cells 104. This will be explained in more detail using further embodiments of the invention described below.

Figure 4:
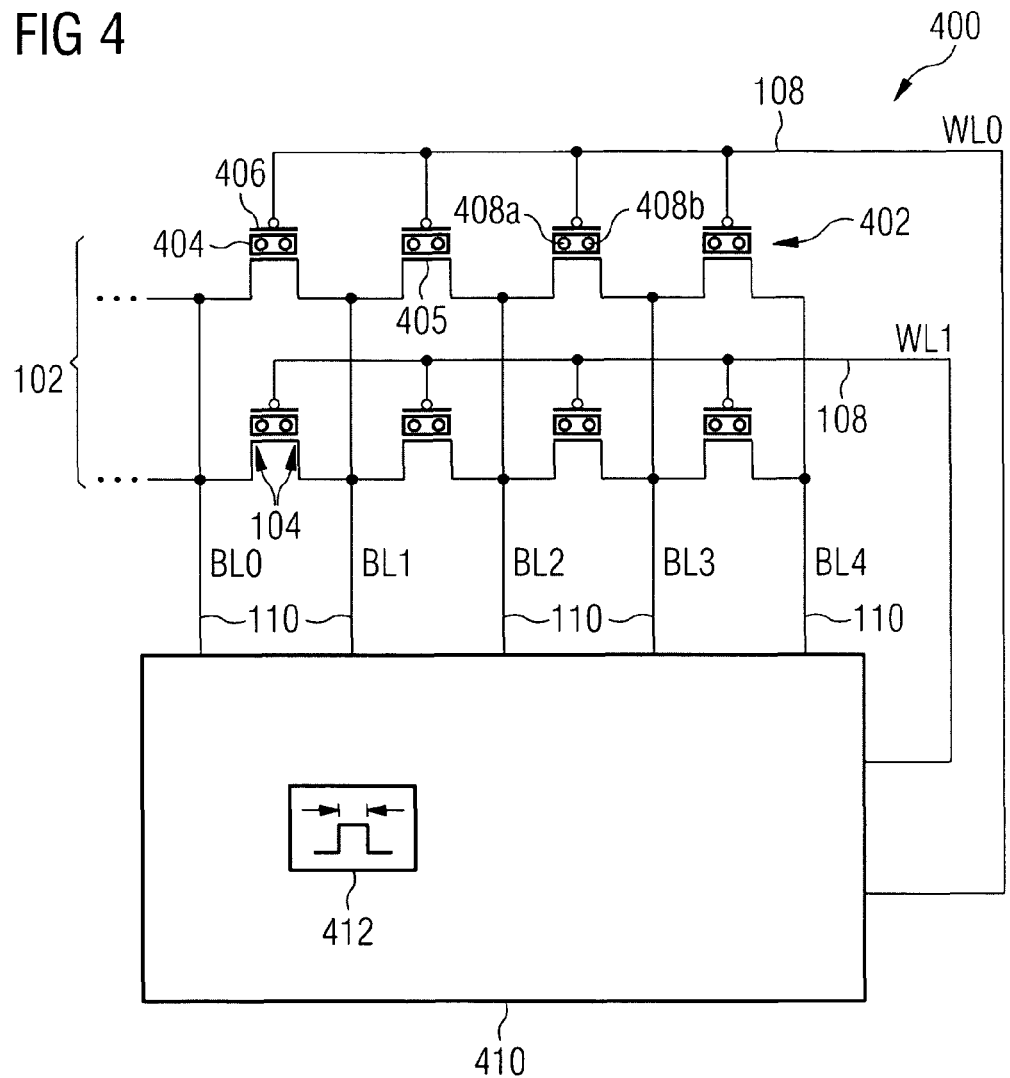
FIG. 4 shows a block diagram of an integrated circuit according to a further embodiment.

FIG. 4 shows an integrated circuit according to a further embodiment of the invention. The integrated circuit comprises a non-volatile NROM memory 400. The NROM memory 400 comprises an array 102 comprising a plurality of non-volatile NROM cells 402. The NROM cells 402 are arranged in a so-called NOR structure. In the NOR structure, a bitline 110 is connected in-between any two NROM cells 402. In addition, all NROM cells 402 of a row of the array 102 are connected to a common wordline 108. The integrated circuit further comprises control circuitry 410. The control circuitry 410 is connected to the bitlines 110 and word lines 108. The control circuitry comprises a pulse width modulator 412.

Each NROM cell 402 comprises a modified field-effect transistor. The NROM cell 402 comprises a charge storage element 404, for example, a nitride layer, sandwiched between a control gate 406 and a source/drain channel 405, i.e., an area of the semiconductor substrate arrange between a source area and a drain area. In so-called twin-bit NROM cells 402, there are two separate charge trapping areas 408a and 408b. The charge trapping areas 408a and 408b are arranged in a left and a right part of each NROM cell 402, respectively. Each twin-bit NROM cell 402 may store at least two bits of information.

In addition or alternatively to the storage of charge in a left and right charge trapping area 408a and 408b as shown in FIG. 4, the amount of charge stored in a charge storage element 404 may be varied. In this way, two or more bits of information may be stored within the same charge trapping area 408.

In the NROM device 400 presented in FIG. 4, each NROM cell 402 comprises two memory cells 104, associated with the charge trapping areas 408a and 408b, respectively. Thus, each row of NROM cells 402 shown in FIG. 4 is capable of storing eight bits of information. However, as described above, the array 102 may be a portion of a much larger array structure comprising many more memory cells 104.

In order to erase the information stored in each memory cell 104, each NROM cell 402 must be subjected to two subsequent electrical erase sequences in order to remove the charge stored in the left and right charge trapping area 408a and 408b, respectively. For example, the NROM device 400 may be erased in the following manner. At first, all NROM cells 402 are programmed to a predefined threshold level.

Subsequently, there are two erase cycles, during which the odd and even bitlines 110 are subjected to different electrical erase sequences, respectively. In particular, the odd and even bitlines 110 are connected to predetermined voltage levels in a successive fashion. For example, in a first erase cycle, the odd bitlines 110 may be connected to a voltage potential of 5 V, and, in a second erase cycle, the even bitlines 110 may be connected to a voltage potential of 5 V. The remaining bitlines 110 in each cycle, i.e., the even bitlines in the first erase cycle and the odd lines in the second erase cycle, are not connected and consequently left floating. At the same time, i.e., during both the first and second erase cycle, the control gates 406 are connected to a second voltage potential, for example electrical ground.

In this way, by sending an electrical erase sequence to every second bitline 110 during any erase cycle, only the charge trapped in one of the charge trapping areas 408a and 408b of each NROM cell 402 is erased. For example the left or right charge trapping area 408a or 408b shown in FIG. 4 may be erased by hot hole injection. Other methods of adding charge to or removing charge from the charge trapping area 408a or 408b may be used. Examples include the use of hot electron injection or Fowler-Nordheim tunneling.

The erase cycle described above is repeated twice, once for the odd bitlines 110 and once for the even bitlines in order to erase all memory cells 402 comprised in the array 102 of the NROM device 400. Other sequences are possible and include, among others, a reversed order, i.e., first connecting the even bitlines 110 followed by the odd bitlines. Furthermore alternative groupings of memory cells 104 may be used. For example, four groups, each group comprising memory cells 104 connected to each one of the four bitlines 110, respectively.

According to this embodiment, when erasing the even-numbered bitlines 110 after having already erased the odd-numbered bitlines 110, the effectiveness of the electrical erase sequence will be different than before. This is due to the fact that due to the so-called second bit effect, the charge stored in one of the charge trapping areas 408a and 408b effects erase operations in the corresponding other charge trapping areas 408b or 408a, respectively. In addition, bitlines 110 left floating during a phase of the erase procedure will be charged to an intermediate voltage, thus influencing the electrical field within the NROM cells 402. Consequently, the effectiveness of the second electrical erase sequence used during the second erase cycle will be different from the effectiveness of the first electrical erase sequence used in a first erase cycle.

In particular, in the NROM device 400 shown in FIG. 4, the second electrical erase sequence will be less effective than the first electrical erase sequence. Consequently, the control circuitry 410 comprising the pulse width modulator 412 will provide a second electrical erase sequence to the even bitlines 110, comprising one or more erase pulses having a longer duration then the erase pulses of the first electrical erase sequence.

In another embodiment of the invention, memory cells 104 connected to different bitlines 110 are erased concurrently. For example, in an integrated circuit comprising a control circuitry having multiple pulse generators or a more powerful power supply unit (not shown), all memory cells 104 of a block of memory cells may be erased at the same time by connecting corresponding bitlines 110 to respective programming units 114. Although, in this embodiment, there is no temporal dependence between individual memory cells 104 during an erase operation, their spatial arrangement may still require to provide different bitlines with different electrical erase sequence.

For example, bitlines 110 arranged at a boundary of an array 102 or a block of an integrated circuit may be connected to fewer memory cells 104 than bitlines 110 arranged in an interior of the array 102 or block. In an integrated circuit comprising a plurality of floating gate transistors, acting as memory cells 104 and arranged in a NOR architecture similar to the one depicted in FIG. 4, only two memory cells 104 are connected to the left- and rightmost bitline 110, while four memory cells 104 are connected to the three inner bitlines 110 arranged in between the left- and rightmost bitline 110. Thus, a first electrical erase sequence with a first total current or voltage may be provided to the outer bitlines 110 while, at the same time, a second electrical erase sequence with a second current or voltage may be supplied to the inner bitlines 110.

In the example described above, the effectiveness of the first and second electrical erase sequences is determined by the arrangement of the array 102 and characteristics of the memory cells 104 themselves. For this reason, it is possible to predetermine the amplitude, duration or shape of a first and second erase pulse of the first and second electrical erase sequences, respectively. Such predetermined parameters may then be used by the control circuitry 410 to erase the memory cells 104 associated with a first and second area of the array 102, like the left and right charge trapping areas 408*a* and 408*b* of NROM cells 402.

For example, in a integrated circuit comprising an array 102 of NROM cells 402 arranged in a NOR architecture, a first erase pulse may be programmed using an erase voltage of 5 V, whereas a second erase pulse having an erase voltage of 6 V may be used. Alternatively, the current provided during the first and second erase cycles, or the duration or shape of the erase pulse may be adjusted.

Figure 5:
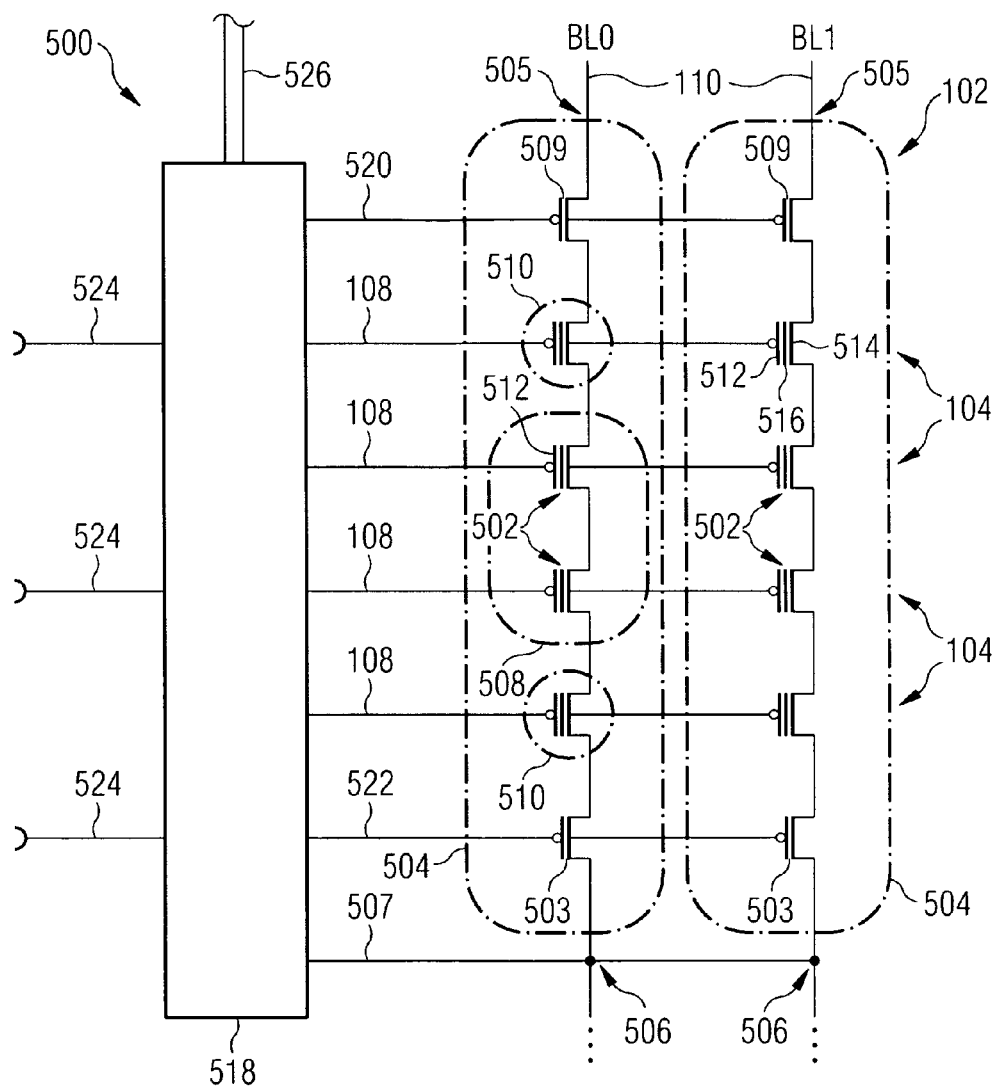
FIG. 5 shows a block diagram of an integrated circuit according to a further embodiment.

FIG. 5 shows a Flash-EEPROM device 500 according to a further embodiment of the invention. The Flash-EEPROM device 500 comprises floating gate transistors 502 arranged in a so-called NAND architecture. According to the NAND architecture, a plurality of memory cells 104 is connected in series. Each memory cell 104 may comprise a charge trapping area, floating gate or any other storage element.

In the embodiment shown in FIG. 5, a plurality of floating gate transistors 502 and selection transistors 503 are connected in series to form two NAND structures 504. All floating gate transistors 502 are embedded in a single well structure (not shown) of a substrate, for example, a p-doped area of a semiconductor substrate. In this way, the number of bitlines 110 used in the array 102 is reduced compared with an array in the previously described NOR architecture comprising the same number of memory cells 104. In general, a NAND memory device occupies less circuit area than a corresponding NOR memory device comprising the same amount of memory cells 104.

In the example presented in FIG. 5, each floating gate transistor 502 forms a single memory cell 104. However, there may be arrays 102 comprising NAND structures 504 in which each floating gate transistor 502 comprises a plurality of physical or logical distinct memory cells 104. For example, a floating gate transistor 502 may be used to store a plurality of bits of information in a so-called multi-level memory cell.

In the example shown in FIG. 5, each NAND structure 504 comprises four floating gate transistors 502 and two selection transistors 503 connected in series. A first terminal region 505 of each NAND structure 504 is connected to a bitline 110. A second terminal region 506 of each NAND structure 504 is connected to a source line 507. The source line 507 may be used to supply a predefined voltage potential, for example, electrical ground.

As indicated on the left-hand side of FIG. 5, the floating gate transistors 502 of each NAND structure 504 may be divided into two floating gates 502 arranged in a central area 508 and two floating gate transistors 502 arranged in two separate peripheral areas 510. The two peripheral areas 510 differ from the central area 508 in that they are closer to the selection transistors 503. These are also referred to as drain and source select gate. They connect the floating gate transistors 502 with the first and second terminal region 505 and 506, respectively. The floating gates transistors 502 of the central area 508 are at least connected to two neighboring floating gate transistors 502 each, while those of the peripheral areas 510 are each connected to a single neighboring floating gate transistor 502 and a selection transistor 503.

In the embodiment shown, the source line 507 is connected to a NAND controller 518, which also comprises control circuitry to provide signals to the selection transistors 503. These signals are provided by means of a drain select line 520 and a source select line 522, respectively. In addition, all wordlines 108 are connected to the NAND controller 518 for supplying control voltages to the control gates 512 of the floating gate transistors 502. The NAND controller 518 is further connected to a plurality of supply voltages by inputs 524 and to other control circuitry (not shown) by means of a control bus 526. Alternatively, the NAND controller 518 may comprise one or a plurality of internal voltage sources, converters or dividers (not shown), in order to generate a plurality of control voltages from a single or a few supply voltages. According to the embodiment shown in FIG. 5, the NAND controller 518 is adapted to provide a plurality of different voltage, e.g. 0 V, 0.5 V and 1.0 simultaneously to the different wordline 108 connected to it.

During a read operation, all wordlines 108 connected to control gates 512 of floating gate transistors 502 of a NAND structure 504, which are not to be read, are connected to a common voltage potential. The common voltage potential effectively enables a current to flow through the source/drain channel 514 of a corresponding floating gate transistor 502, irrespective of a charge stored on its floating gate 516. A control gate 512 of a single floating gate transistor 502 is not connected to the common voltage potential. In this manner, the single floating gate transistor 502 can be selected for reading within a NAND structure 504.

For example, during a read operation, all wordlines 108 of memory cells 104 not to be read may be connected to a predefined voltage, for example, 6 V. Applying the predefined voltage to the respective wordlines 108 enables a current to flow through these memory cells irrespective of their current programming state. At the same time, the control gates of both selection transistors 503 may be connected to a voltage of 3.5 V. The source line 507 and well structure may be connected to electrical ground, i.e., 0 V. Depending on the type of floating gate transistor 502 used the wordline 108 of the memory cell 104 to be read may be biased with a voltage of 0 V, 1.5 V or 3 V. Its programming state is then sensed via a read amplifier (not shown) connected to the corresponding bitline 110. The sensed current will depend on the amount of charge stored on the floating gate 516 of the selected floating gate transistor 502.

During a program operation, all wordlines 108 of memory cells 104 not to be programmed may be connected to a voltage potential of 10 V. The selection transistor 503 connected to the drain select line 520 may be connected to a voltage of 3.5 to 5.0 V. The selection transistor 503 connected to the source select line 522 and the well structure may be connected to a voltage of 0 V and the source line 507 may be connected to a voltage of 2.5 V. Depending on the type of floating gate transistor 502 used and the length of a programming pulse, the wordline 108 associated with the memory cell 104 to be programmed may be connected to a voltage of 16 to 24 V. For a bit of data to be programmed, the voltage difference between the control gate 512 and the well structure equals to roughly 20 V. This is sufficient for Fowler-Nordheim tunneling to occur, moving additional charge to the floating gate 516. In contrast, the voltage difference seen by other floating gate transistors 502 biased with 10V is essentially too low for Fowler-Nordheim tunneling to take place.

The further discussion will focus on an embodiment of a method for erasing a NAND structure according to the invention. It will be described with reference to the NAND structure described with reference to FIG. 5, but may also be employed by other integrated circuits and memory devices.

During an erase operation, the drain select line 520, the source select line 522 and the source line 507 are left floating. The source line in particular will follow the potential of the well structure, which is 24 V in the described example. At the same time, all wordlines 108 are connected to electrical ground for erasing of all memory cells 104 comprised in a selected NAND structure 504. Thus, the difference in voltage between the control gates 512 and the well structure of each floating gate transistor 502 should amount to 24 V. This potential is used for removing charge from all floating gates 516 of a NROM structure 504, for example, by Fowler-Nordheim tunneling.

As described above, the arrangement of the floating gate transistors 502 and selection transistor 503 will affect the voltage potential seen during any such operation by the remaining floating gate transistor 502 of the NAND structure 504. Consequently, in particular floating gate transistors 502 arranged in a peripheral area 510 may react differently to an electrical erase sequence provided via the wordlines 108 compared to floating gate transistors 502 arranged in the central area 508.

According to an embodiment of the invention, when programming or erasing memory cells 104 arranged in a peripheral area 510, a second electrical erase sequence may be provided. The second electrical erase sequence differs from a first electrical erase sequence provided to memory cells 104 arranged in the central area 508. For example, wordlines 108 connected to floating gate transistors 502 of the peripheral area 510 may by connected to an offset potential during the erase operation, for example, 0.5 V or 1.0 V. Providing the offset potential is part of the second electrical erase sequence used for erasing the memory cells 104 of the central area 508.

According to a further embodiment of the invention, a plurality of areas may be defined for a NAND structure 504. In particular, for a NAND structure 504 comprising a plurality of floating gate transistors 502 connected in series, for example, 8 or 16 floating gate transistors 502, the NAND structure 504 may be divided into three, four or even more areas. Dividing the NAND structure into more areas allows adapting an electrical erase sequence to the individual needs of each area. For example, a floating gate transistor 502 directly neighboring a selection transistor 503 may be erased using a first erase pulse having a voltage of 400 mV below a predefined erase voltage potential. A floating gate transistor 502, which is arranged next to a floating gate transistor 502 connected to the selection transistor 503, may be erased using an second erase pulse having a voltage of 200 mV below a predefined erase voltage. All remaining floating gate transistors 502 of a NAND structure 504 may be provided with an erase pulse having the predefined erase voltage, for example, 24 V.

FIG. 6 shows an embodiment of a method to operate an integrated circuit. The method according to FIG. 6 may be implemented in hard- or software or a combination thereof, comprised in a control unit or other components of any integrated circuit or connected host system.

In a step 602, a first group of memory cells 104 is selected. For example, by connecting every odd-numbered bitline 110 to a predetermined voltage potential, memory cells 104 connected to that bitline may be selected.

In a further step 604, a first electrical erase sequence is supplied to the memory cells 104 of the first area. For example, a single first erase pulse having a duration of 10.0 ms and an amplitude of 15.0 V may be provided to the odd-numbered bitlines 110.

In a further step 606, a second group of memory cells 104 is selected. For example, by connecting the even-numbered bitlines of an array 400, all memory cells 104 connected to the corresponding bitline 110 may be selected.

In a further step 608, a second electrical erase pulse is provided to all memory cells 104 of the second area. For example, a single second erase pulse having a duration of 10.0 ms and an amplitude of 15.5 V may be provided to the memory cells 104 connected to the even-numbered bitlines 110. Alternatively, an erase pulse having a length of, for example, 10.5 ms and an amplitude of 15.0 V may be provided. Depending on the characteristic response of the used memory cell technology, an adaptation of the pulse shape may also be performed. For example, if a saw tooth voltage is used for erasing, the gradient of its voltage increase or decrease may be adjusted. In addition, a combination of multiple parameters of the second electrical erase sequence may be changed with respect to the first electrical erase sequence.

As a consequence of providing a second erase pulse that differs from the first erase pulse in either the pulse duration, pulse amplitude or pulse shape, a narrow distribution as shown in FIG. 3B can be achieved for all memory cells 104 that have been erased. In the example described, this is achieved by using only a single erase pulse for each memory cell 104. In this way, the stress put onto each memory cell 104 during an erase operation is reduced. This also enhances the life expectation and reliability of the integrated circuit as a whole. Equally, by starting a subsequent program operation from a very narrow distribution of threshold levels in the erased state, subsequent programming will be more uniform. In this case, less verification effort is required. This also results in a distribution of threshold levels in the programmed states that is narrower as well.

FIG. 7 shows an embodiment of a method to determine an electrical erase sequence for an integrated circuit. The method shown in FIG. 7 may be applied, for example, during chip testing or qualification, i.e., as a step of a manufacturing process. Alternatively, or in addition, the method may be used during initialization of the integrated circuit, e.g., during start-up or on connecting it to a host system. It may also be used on a regular basis, triggered, for example, by control circuitry after a fixed number of accesses or hours of operation.

In an optional step 702, a first electrical erase sequence for erasing a first memory cell 104 is determined. The electrical erase sequence is adapted to bring the first memory cell to a predefined erase threshold, for example 1.8 V. For example, during device grading or characterization, a number of different erase pulse amplitudes or lengths may be tested on one or more memory cells 104 in order to determine the electrical erase sequence characteristics that will result in an erasure of said memory cell 104 to the predetermined erase threshold. Alternatively a fixed first electrical erase sequence may be used. The fixed first electrical erase sequence may be determined, for example, during circuit design.

In a further step 704, the first memory cell 104 is erased. Erasing includes application of the first electrical erase sequence to the first memory cell. For example, a first erase pulse having a predetermined length and amplitude may be provided to a bitline 110 or wordline 108. Erasing the first memory cell 104 may affect a second memory cell 104 of the integrated circuit. For example, a bitline 110 connected to the second memory cell may be charged.

In a further step 706, a second electrical erase sequence is determined. The second electrical erase sequence is used to erase the second memory cell 104 and is performed in essentially the same way as described above. However, since the second memory cell 104 is already affected by erasing the first cells 104, the determined second electrical erase sequence characteristics will be different from those used for erasing for the first memory cell 104.

In an alternative embodiment, a fixed erase current or voltage is supplied to at least one second memory cell 104. At the same time, an observable characteristic, like a threshold voltage or current of the memory cell 104 to be erased is continually or repeatedly measured. As soon as the observable characteristic indicates that the memory cell 104 has reached the predetermined erase threshold, the erase current or voltage is cut off, noting its length as a control parameter.

Alternatively, instead of determining the pulse parameters required for the second electrical erase sequence, a bias caused by the first electrical erase sequence on the memory cells 104 of the second area may be measured or estimated. Hence, control parameters of the second electrical erase sequence may be computed based on a predictive model of the physical effects in the array 102.

In order to improve the precision and reliability of the obtained control parameters, steps 704 and 706 and, optionally, step 702, may be performed repeatedly or on a large number of memory cells 104. In this way, a plurality of values may be obtained, which may be averaged or otherwise statistically analyzed in order to estimate control parameters for the first or second electrical erase sequence or erase pulses used for future operation of the integrated circuit.

In a further, optional step 708, at least one control parameter characterizing the first electrical erase sequence is stored in the predetermined part of the array or other part of the integrated circuit. For example, the pulse duration or amplitude may be stored in a control register of the control unit 116. In case a fixed electrical erase sequence having a predetermined duration, amplitude and shape is used for erasing the first memory cell 104 of the array 102, the step 708 may be omitted.

In a further optional step 710, at least one control parameter characterizing the second electrical erase sequence is stored in the integrated circuit. For example, a relative or absolute offset of the second electrical erase sequence with respect to the first electrical erase sequence may be stored in the integrated circuit. Alternatively, one or more control parameters for the second electrical erase sequence or a second erase pulse, for example its duration or amplitude, may be stored in encoded form in the integrated circuit.

The method described above may also be used as part of a long-term validation or maintenance method, e.g., a method employed by control circuitry of an integrated circuit at regular intervals. For example, a range 230 or 330 of a distribution of threshold levels as disclosed in FIG. 2B may be determined. In case the determined range exceeds beyond a predetermined threshold level, corrective action may be performed. For example, data stored in one validated section of the integrated circuit may be copied by another section of the integrated circuit. Alternatively or in addition, in integrated circuits used for the long-term storage of data, control parameters used for erasing memory cells 104 may be adjusted from time to time, for example, after a predetermined number of erase operations or months of operation, in order to take into account any degradation of the integrated circuit.

Although FIGS. 6 and 7 show flow charts indicating a particular order of individual method steps, many of the method steps may be performed in an order different from the one described above without departing from the spirit of the present invention. Equally, some of the method steps may be performed in parallel in order to speed up execution. Thus, while the method steps were described in a particular order, any other order which achieves a similar goal performing similar steps shall be covered by the present application as determined by the following patent claims.

Equally, all features disclosed with reference to one embodiment may also be used in combination with any other embodiment, alone or in combination with any other feature disclosed within this application.

Different embodiments of the integrated circuit may comprise individual memory cells, large arrays of memory cells alone or complex circuitry with embedded memories of a larger system chip. In general, one or several memory cells described herein may be formed in an integrated circuit according to techniques otherwise known in the art. Such an integrated circuit may, for example, include additional logic circuitry, processors, ASICs and so on.

Furthermore, although the embodiments described above referred to widely used NROM and floating gate EEPROM memories, any other known or future type of volatile or non-volatile memory such as multi-level cells (MLC), static RAM (SRAM), dynamic RAM (DRAM), Ferro-electric RAM (FRAM, FeRAM), Magneto-resistive RAM (MRAM), Phase Change Memory (PCM), Phase Change RAM (PCRAM), Chalcogenide RAM (C-RAM), Ovonic Unified Memory (OUM), Programmable Metallization Cell (PMC), Organic RAM (ORAM), Conductive Bridge RAM (CBRAM), Nanotube RAM (NRAM) may be used in conjunction with the inventive concept as described herein.

What is claimed is:

1. A method of operating an integrated circuit that comprises at least a first and a second memory cell, the method comprising:
    selecting the first memory cell for erasing;
    supplying a first electrical erase sequence to the first memory cell, thereby affecting the second memory cell, wherein the first electrical comprises at least one first erase pulse;
    selecting the second memory cell for erasing; and
    supplying a second electrical erase sequence to the second memory cell, wherein the second electrical erase sequence comprises at least one second erase pulse,
    wherein the second electrical erase sequence differs from the first electrical erase sequence in at least one of pulse duration, pulse amplitude, and/or pulse shape, and
    wherein the second electrical erase sequence takes into account an effect of the first electrical erase sequence on the second memory cell.

2. The method of claim 1, wherein the second electrical erase sequence is determined based, at least in part, on a bias of the second memory cell caused by the supplying of the first electrical erase sequence to the first memory cell.

3. The method of claim 1, wherein the first and second electrical erase sequences are predetermined based, at least in part, on a physical arrangement of the first and the second memory cell.

4. The method of claim 1, wherein the first and second electrical erase sequences are supplied successively.

5. An integrated circuit comprising:
    a memory, the memory comprising at least a first memory cell and a second memory cell, the first and second memory cell being erasable by application of at least one electrical erase sequence; and
    control circuitry coupled to the first memory cell and second memory cell, the control circuitry being adapted to erase the first memory cell by applying a first electrical erase sequence and to erase the second memory cell by applying a second electrical erase sequence, wherein the second electrical erase sequence is different than the first electrical erase sequence and wherein second electrical erase sequence takes into account an effect of the first electrical erase sequence on the second memory cell, and
    wherein the first electrical erase sequence comprises only one first erase pulse and the second electrical erase sequence comprises only one second erase pulse, the second erase pulse being different from the first erase pulse in at least one of pulse duration, pulse amplitude, and/or pulse shape.

6. The integrated circuit of claim 5, wherein the second electrical erase sequence is based on a parameter stored in the integrated circuit.

7. The integrated circuit of claim 5, wherein
the memory comprises at least one first group of memory cells, the first group comprising the first memory cell and being coupled to a first programming line; and
the memory further comprising at least one second group of memory cells, the second group comprising the second memory cell and being coupled to a second programming line;
wherein the control circuitry is adapted to provide the first electrical erase sequence to the first programming line and the second electrical erase sequence to the second programming line.

8. The integrated circuit of claim 5, wherein the memory comprises a structure of memory cells connected in series, wherein the first memory cell is arranged in a central area of the structure and the second memory cell is arranged in a peripheral area of the structure.

9. An integrated circuit comprising:
a memory, the memory comprising a first group of memory cells and a second group of memory cells;
at least one first programming line to supply a first erase pulse to the first group of memory cells, the first erase pulse affecting the second group of memory cells;
at least one second programming line to supply a second erase pulse to the second group of memory cells;
control circuitry adapted to determine the pulse duration, pulse amplitude, and pulse shape of the second erase pulse, such that the second erase pulse differs from the first erase pulse; and
an erase pulse generator, the erase pulse generator being adapted to provide the first erase pulse to the first programming line and to provide the second erase pulse to the second programming line, wherein one of the erase pulse generator and the control circuitry is adapted to take into account an effect of the first erase pulse on the second group of memory cells, and wherein the erase pulse generator comprises at least one pulse width modulator.

10. The integrated circuit of claim 9, wherein the erase pulse generator comprises voltage supply circuitry, the voltage supply circuitry being adapted to provide a first voltage to the first programming line and a second voltage to the second programming line.

11. The integrated circuit of claim 9, wherein the first and the second group of memory cells are adapted to store one of a plurality of programming states.

12. The integrated circuit of claim 9, wherein the memory comprises a plurality of odd and even programming lines, each programming line being coupled to at least one memory cell, and the first group of memory cells comprises a plurality of memory cells connected to at least one of the odd programming lines and the second group of memory cells comprises a plurality of memory cells connected to at least one of the even programming lines.

13. A method of determining an electrical erase sequence for operating an integrated circuit comprising a first and a second memory cell, the method comprising:
programming the first and second memory cells to a predetermined program threshold;
erasing the first memory cell to a predefined erase threshold by supplying a first erase pulse to the first memory cell using a first pulse shape, first pulse amplitude and first pulse duration, thereby affecting the second memory cell;
erasing the second memory cell by supplying a second erase pulse to the second memory cell until the predefined erase threshold has been reached; and
determining at least one of a second pulse shape, second pulse amplitude and second pulse duration of the second erase pulse, the second electrical erase pulse taking into account the erasing of the first memory cell.

14. The method of claim 13, further comprising storing at least one control parameter characterizing the second electrical erase pulse.

15. The method of claim 13, wherein the determination of one of the second pulse shape, second pulse amplitude and second pulse duration is performed repeatedly, and at least one control parameter is determined based on a distribution of one of the determined second pulse shapes, second pulse amplitudes, and second pulse durations.

16. The method of claim 13, further comprising:
comparing an actual erase threshold of the first or second memory cell with the predefined erase threshold after erasing the first or second memory cell, respectively; and
adjusting at least one of the first and second electrical erase pulse, if the actual erase threshold and the predefined erase threshold differ by more than a predetermined amount.

17. An integrated circuit comprising:
a memory comprising at least a first and a second memory cells; and
control means for performing an erase operation, wherein the erase operation comprises supplying a first electrical erase sequence to the first memory cell and the second electrical erase sequence to the second memory cell, the second electrical erase sequence being different from the first electrical erase sequence and being determined based on an effect the first electrical erase sequence has on the second memory cell, and
wherein the first electrical erase sequence comprises at least one first erase pulse and the second electrical erase sequence comprises at least one second erase pulse, the second erase pulse being different from the first erase pulse in at least one of pulse duration, pulse amplitude, and/or pulse shape.

18. The integrated circuit of claim 17, further comprising power supply means for supplying electrical power for the first and second electrical erase sequences.

\* \* \* \* \*